US011967120B2

(12) United States Patent
Zhang et al.

(10) Patent No.: US 11,967,120 B2
(45) Date of Patent: Apr. 23, 2024

(54) ATTRIBUTE CODING OF DUPLICATE POINTS FOR POINT CLOUD CODING

(71) Applicant: TENCENT AMERICA LLC, Palo Alto, CA (US)

(72) Inventors: Xiang Zhang, Mountain View, CA (US); Wen Gao, West Windsor, NJ (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 380 days.

(21) Appl. No.: 17/368,133

(22) Filed: Jul. 6, 2021

(65) Prior Publication Data

US 2022/0067981 A1 Mar. 3, 2022

Related U.S. Application Data

(60) Provisional application No. 63/120,557, filed on Dec. 2, 2020, provisional application No. 63/070,471, filed on Aug. 26, 2020.

(51) Int. Cl.
*G06T 9/00* (2006.01)
*H03M 7/30* (2006.01)

(52) U.S. Cl.
CPC ........... *G06T 9/001* (2013.01); *H03M 7/3071* (2013.01); *H03M 7/3077* (2013.01); *H03M 7/6005* (2013.01); *H03M 7/6011* (2013.01)

(58) Field of Classification Search
None
See application file for complete search history.

(56) References Cited

U.S. PATENT DOCUMENTS 11,451,802 B2 * 9/2022 Yea ...................... H04N 19/186
11,710,259 B2 * 7/2023 Zhang ..................... G06T 9/001 382/232
2015/0066876 A1 3/2015 Li et al.
2019/0028725 A1 * 1/2019 Zhang .................. H04N 19/187
2019/0122393 A1 * 4/2019 Sinharoy ................. G06T 9/001
2019/0306521 A1 * 10/2019 Zhao ...................... H04N 19/60
2020/0043199 A1 2/2020 Chang et al.
(Continued)

OTHER PUBLICATIONS

Written Opinion of the International Searching Authority dated Oct. 13, 2021 in International Application No. PCT/US21/41253.
(Continued)

*Primary Examiner* — Tahmina N Ansari
(74) *Attorney, Agent, or Firm* — Sughrue Mion, PLLC

(57) ABSTRACT

A method, computer program, and computer system is provided for point cloud coding. The method includes receiving, from a bitstream, data corresponding to a point cloud; reconstructing, based on the data, a first attribute value of a first duplicate point from among a plurality of duplicate points corresponding to a single geometry position; obtaining at least one prediction residual corresponding to at least one remaining attribute value of at least one remaining duplicate point from among the plurality of duplicate points; reconstructing the at least one remaining attribute value based on the reconstructed first attribute and the at least one prediction residual; and decoding the data corresponding to the point cloud based on the reconstructed first attribute value and the reconstructed at least one remaining attribute value.

18 Claims, 12 Drawing Sheets

300

Receiving, from a bitstream, data corresponding to a point cloud — 311

Reconstructing, based on the data, a first attribute value of a first duplicate point from among a plurality of duplicate points corresponding to a single geometry position — 312

Obtaining at least one prediction residual corresponding to at least one remaining attribute value of at least one remaining duplicate point from among the plurality of duplicate points — 313

Reconstructing the at least one remaining attribute value based on the reconstructed first attribute and the at least one prediction residual — 314 decoding the data corresponding to the point cloud based on the reconstructed first attribute value and the reconstructed at least one remaining attribute value — 315

(56) References Cited

U.S. PATENT DOCUMENTS

| | | | | |
|---|---|---|---|---|
| 2021/0248785 | A1* | 8/2021 | Zhang | H04N 19/17 |
| 2021/0329270 | A1* | 10/2021 | Yea | H04N 19/174 |
| 2022/0067981 | A1* | 3/2022 | Zhang | G06T 9/001 |

OTHER PUBLICATIONS

International Search Report dated Oct. 13, 2021 in International Application No. PCT/US21/41253.

Rufael Mekuria et al., "Requirements for Point Cloud Compression", International Organisation for Standardisation Organisation Internationale De Normalisation ISO/IEC JTC1/SC29/WG11 Coding of Moving Pictures and Audio; ISO/IEC JTC1/SC29/WG11 MPEG2016/n16330 Feb. 2016, Geneva, CH.

Christian Tulvan et al., "Use Cases for Point Cloud Compression (PCC)", International Organisation for Standardisation Organisation Internationale De Normalisation ISO/IEC JTC1/SC29/WG11 Coding of Moving Pictures and Audio; ISO/IEC JTC1/SC29/WG11 MPEG2015/ N16331 Jun. 2016, Geneva, CH.

Khaled Mammou et al., "G-PCC codec description v2", International Organisation for Standardisation Organisation Internationale De Normalisation ISO/IEC JTC1/SC29/WG11 Coding of Moving Pictures and Audio; ISO/IEC JTC1/SC29/WG11 N18189 Jan. 2019, Marrakech, MA.

CD stage, Information technology—MPEG-I (Coded Representation of Immersive Media)—Part 9: Geometry-based Point Cloud Compression, ISO/IEC 23090-9:2019(E).

Extended European Search Report dated Dec. 12, 2022 in European Application No. 21862310.6.

Khaled Mammou, "PCC Test Model Category 3 v1", International Organisation for Standardisation Organisation Internationale de Normalisation ISO/IEC JTC1/SC29/WG11 Coding of Moving Pictures and Audio, 2018, N17349, Gwangju, Republic of Korea, January (8 pages total).

Loi Keng Liang et al., "[G-PCC] [EE13.8 Related] Predictive tree encoding modifications", International Organisation for Standardisation Organisation Internationale de Normalisation ISO/IEC JTC1/SC29/WG11 Coding of Moving Pictures and Audio, 2020, MPEG2019/m53538, Alpbach, AT, April (11 pages total).

* cited by examiner

200D

| Prediction_residual (isSignBitInferred) { | **Descriptor** |
| --- | --- |
| **prediction_residual_is_zero[i]** | ae(1) |
| if ( !prediction_residual_is_zero[i] ) { | |
| if (!isSignBitInferred) { | |
| **prediction_residual_sign** | ae(1) |
| } | |
| **prediction_residual_abs_is_one[i]** | ae(1) |
| if (!prediction_residual_abs_is_one[i]) { | |
| **prediction_residual_abs_is_two[i]** | ae(1) |
| if (!prediction_residual_abs_is_two[i]) { | |
| **prediction_residual_abs_minus_three[i]** | ue(v) |
| } | |
| } | |
| } | |
| } | |

| Prediction_residual (isSignBitInferred) { | **Descriptor** |
| --- | --- |
| for (i = 0; i < 3; i++) { | |
| **prediction_residual_is_zero[i]** | ae(1) |
| if ( !prediction_residual_is_zero[i] ) { | |
| if (i == 0 && !isSignBitInferred) { | |
| **prediction_residual_sign[i]** | ae(1) |
| } | |
| **prediction_residual_abs_is_one[i]** | ae(1) |
| if (!prediction_residual_abs_is_one[i]) { | |
| **prediction_residual_abs_is_two[i]** | ae(1) |
| if (!prediction_residual_abs_is_two[i]) { | |
| **prediction_residual_abs_minus_three[i]** | ue(v) |
| } | |
| } | |
| } | |
| } | |
| } | |

| Prediction_residual (isDuplicatePoint, isAttributeLosslessCoded) { | **Descriptor** |
| --- | --- |
| **prediction_residual_is_zero** | ae(1) |
| if ( !prediction_residual_is_zero ) { | |
| if (!isAttributeLosslessCoded ‖ ! isDuplicatePoint) { | |
| **prediction_residual_sign** | ae(1) |
| } | |
| **prediction_residual_abs_is_one** | ae(1) |
| if (!prediction_residual_abs_is_one) { | |
| **prediction_residual_abs_is_two** | ae(1) |
| if (!prediction_residual_abs_is_two) { | |
| **prediction_residual_abs_minus_three** | ue(v) |
| } | |
| } | |
| } | |
| } | |

<table>
<tr><th>Prediction_residual (isDuplicatePoint, isAttributeLosslessCoded) {</th><th>Descriptor</th></tr>
<tr><td>for (i = 0; i < 3; i++) {</td><td></td></tr>
<tr><td>prediction_residual_is_zero[i]</td><td>ae(1)</td></tr>
<tr><td>if ( !prediction_residual_is_zero[i] ) {</td><td></td></tr>
<tr><td>if (i != 0 || !isAttributeLosslessCoded || ! isDuplicatePoint) {</td><td></td></tr>
<tr><td>prediction_residual_sign[i]</td><td>ae(1)</td></tr>
<tr><td>}</td><td></td></tr>
<tr><td>prediction_residual_abs_is_one[i]</td><td>ae(1)</td></tr>
<tr><td>if (!prediction_residual_abs_is_one[i]) {</td><td></td></tr>
<tr><td>prediction_residual_abs_is_two[i]</td><td>ae(1)</td></tr>
<tr><td>if (!prediction_residual_abs_is_two[i]) {</td><td></td></tr>
<tr><td>prediction_residual_abs_minus_three[i]</td><td>ue(v)</td></tr>
<tr><td>}</td><td></td></tr>
<tr><td>}</td><td></td></tr>
<tr><td>}</td><td></td></tr>
<tr><td>}</td><td></td></tr>
<tr><td>}</td><td></td></tr>
</table>

FIG. 2G

ATTRIBUTE CODING OF DUPLICATE POINTS FOR POINT CLOUD CODING

CROSS-REFERENCE TO RELATED APPLICATION

This application claims priority based on U.S. Provisional Application No. 63/070,471, filed Aug. 26, 2020, and U.S. Provisional Application No. 63/120,557, filed Dec. 2, 2020, in the U.S. Patent & Trademark Office, which is incorporated herein by reference in its entirety.

FIELD

This disclosure relates generally to field of data processing, and more particularly to point cloud coding.

BACKGROUND

Point Cloud has been widely used in recent years. For example, it is used in autonomous driving vehicles for object detection and localization; it is also used in geographic information systems (GIS) for mapping, and used in cultural heritage to visualize and archive cultural heritage objects and collections, etc. Point clouds contain a set of high dimensional points, typically of three dimensional (3D), each including 3D position information and additional attributes such as color, reflectance, etc. They can be captured using multiple cameras and depth sensors, or Lidar in various setups, and may be made up of thousands up to billions of points to realistically represent the original scenes. Compression technologies are needed to reduce the amount of data required to represent a point cloud for faster transmission or reduction of storage.

SUMMARY

Embodiments relate to a method, system, and computer readable medium for point cloud coding. According to one aspect, a method for point cloud coding is provided. The method may include receiving, from a bitstream, data corresponding to a point cloud; reconstructing, based on the data, a first attribute value of a first duplicate point from among a plurality of duplicate points corresponding to a single geometry position; obtaining at least one prediction residual corresponding to at least one remaining attribute value of at least one remaining duplicate point from among the plurality of duplicate points; reconstructing the at least one remaining attribute value based on the reconstructed first attribute and the at least one prediction residual; and decoding the data corresponding to the point cloud based on the reconstructed first attribute value and the reconstructed at least one remaining attribute value.

According to another aspect, a computer system for point cloud coding is provided. The computer system may include one or more computer-readable non-transitory storage media configured to store computer program code; and one or more processors configured to access the computer program code and operate as instructed by the computer program code, said computer program code including: receiving code configured to cause the one or more processors to receive, from a bitstream, data corresponding to a point cloud; first reconstructing code configured to cause the one or more processors to reconstruct, based on the data, a first attribute value of a first duplicate point from among a plurality of duplicate points corresponding to a single geometry position; obtaining code configured to cause the one or more processors to obtain at least one prediction residual corresponding to at least one remaining attribute value of at least one remaining duplicate point from among the plurality of duplicate points; second reconstructing code configured to cause the one or more processors to reconstruct the at least one remaining attribute value based on the reconstructed first attribute and the at least one prediction residual; and decoding code configured to cause the one or more processors to decode the data corresponding to the point cloud based on the reconstructed first attribute value and the reconstructed at least one remaining attribute value.

According to yet another aspect, a computer readable medium for point cloud coding is provided. The computer readable medium may include one or more computer-readable storage devices and a computer program stored on at least one of the one or more tangible storage devices. The computer program may be configured to cause one or more computer processors to: receiving, from a bitstream, data corresponding to a point cloud; reconstructing, based on the data, a first attribute value of a first duplicate point from among a plurality of duplicate points corresponding to a single geometry position; obtaining at least one prediction residual corresponding to at least one remaining attribute value of at least one remaining duplicate point from among the plurality of duplicate points; reconstructing the at least one remaining attribute value based on the reconstructed first attribute and the at least one prediction residual; and decoding the data corresponding to the point cloud based on the reconstructed first attribute value and the reconstructed at least one remaining attribute value.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings:

FIGS. 2D-2G are tables of syntax elements for prediction residuals, according to at least one embodiment;

DETAILED DESCRIPTION

Figure 1:
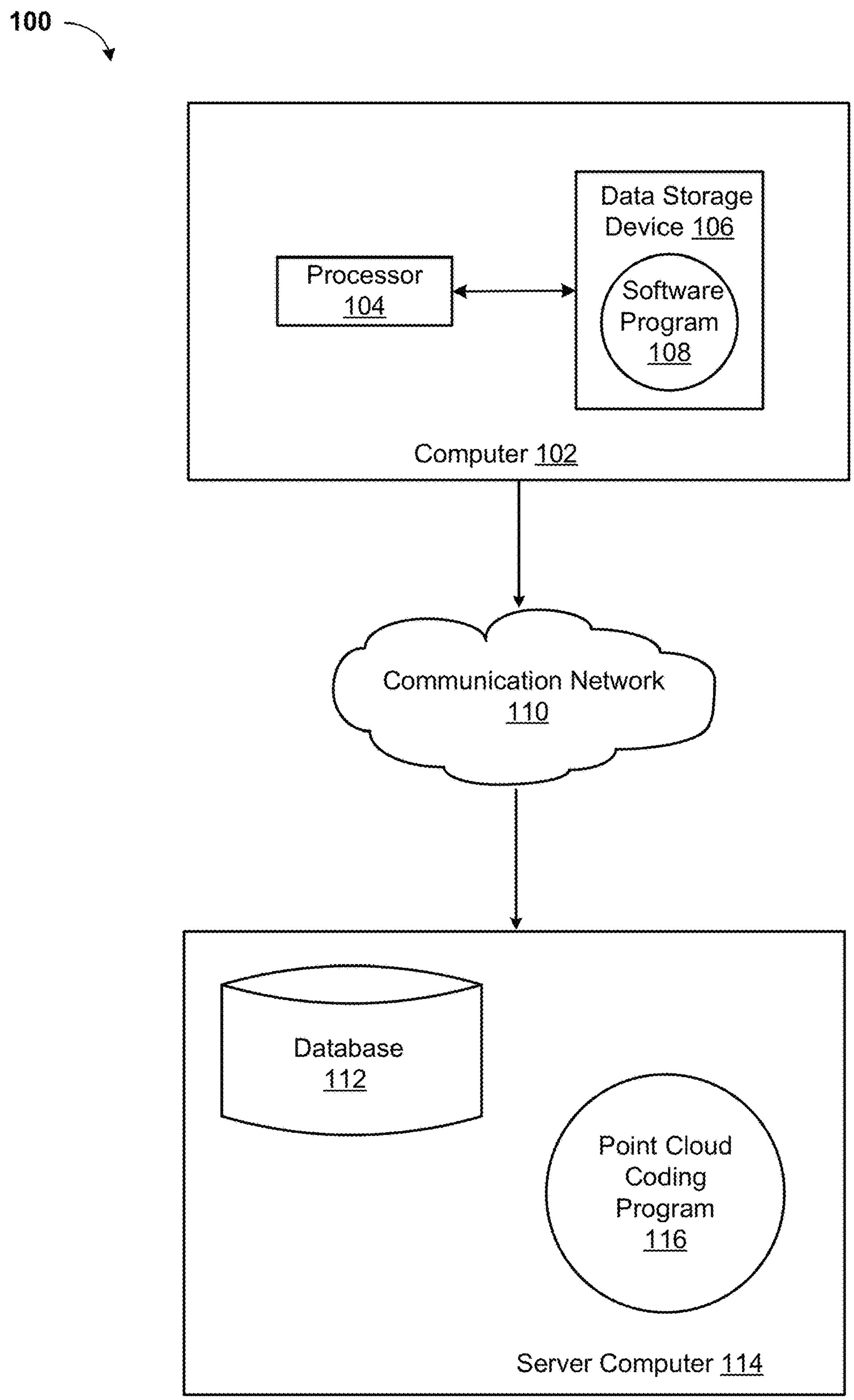
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments relate generally to the field of data processing, and more particularly to point cloud coding. The following described exemplary embodiments provide a system, method and computer program to, among other things, use inter-component correlation methods for coding point cloud attribute data. Therefore, some embodiments have the capacity to improve the field of computing by allowing for increased efficiency of point cloud coding by not requiring finding nearest neighbors of the point cloud data.

As previously described, Point Cloud has been widely used in recent years. For example, it is used in autonomous driving vehicles for object detection and localization; it is also used in geographic information systems (GIS) for mapping, and used in cultural heritage to visualize and archive cultural heritage objects and collections, etc. Point clouds contain a set of high dimensional points, typically of three dimensional (3D), each including 3D position information and additional attributes such as color, reflectance, etc. They can be captured using multiple cameras and depth sensors, or Lidar in various setups, and may be made up of thousands up to billions of points to realistically represent the original scenes. Compression technologies are needed to reduce the amount of data required to represent a point cloud for faster transmission or reduction of storage. In the prediction based attribute coding, the attribute of current point is predicted from the already coded points that are close to current point.

In the TMC13 model, the geometry information and the associated attributes, such as color or reflectance, are separately compressed. The geometry information, which is the 3D coordinates of the point clouds, is coded by octree-partition with its occupancy information. The attributes are then compressed based on reconstructed geometry using prediction, lifting and region adaptive hierarchical transform techniques. However, to find the nearest points in 3D space for each point may be expensive. Additionally, for lossless and near-lossless coding of multiple channel attributes, e.g., RGB colors, the multiple channels are processed directly without color space conversion and coded independently. However, there is usually a strong correlation among different color channels especially in RGB domain. Without utilizing such correlation may result in performance loss in terms of coding efficiency. It may be advantageous, therefore, to use inter-component correlations.

Aspects are described herein with reference to flowchart illustrations and/or block diagrams of methods, apparatus (systems), and computer readable media according to the various embodiments. It will be understood that each block of the flowchart illustrations and/or block diagrams, and combinations of blocks in the flowchart illustrations and/or block diagrams, can be implemented by computer readable program instructions.

Referring now to FIG. 1, a functional block diagram of a networked computer environment illustrating a point cloud coding system 100 (hereinafter "system") for coding point cloud data. It should be appreciated that FIG. 1 provides only an illustration of one implementation and does not imply any limitations with regard to the environments in which different embodiments may be implemented. Many modifications to the depicted environments may be made based on design and implementation requirements.

The system 100 may include a computer 102 and a server computer 114. The computer 102 may communicate with the server computer 114 via a communication network 110 (hereinafter "network"). The computer 102 may include a processor 104 and a software program 108 that is stored on a data storage device 106 and is enabled to interface with a user and communicate with the server computer 114. As will be discussed below with reference to FIG. 4 the computer 102 may include internal components 800A and external components 900A, respectively, and the server computer 114 may include internal components 800B and external components 900B, respectively. The computer 102 may be, for example, a mobile device, a telephone, a personal digital assistant, a netbook, a laptop computer, a tablet computer, a desktop computer, or any type of computing devices capable of running a program, accessing a network, and accessing a database.

The server computer 114 may also operate in a cloud computing service model, such as Software as a Service (SaaS), Platform as a Service (PaaS), or Infrastructure as a Service (laaS), as discussed below with respect to FIGS. 5 and 6. The server computer 114 may also be located in a cloud computing deployment model, such as a private cloud, community cloud, public cloud, or hybrid cloud.

The server computer 114, which may be used for point cloud coding is enabled to run a Point Cloud Coding Program 116 (hereinafter "program") that may interact with a database 112. The Point Cloud Coding Program method is explained in more detail below with respect to FIG. 3. In one embodiment, the computer 102 may operate as an input device including a user interface while the program 116 may run primarily on server computer 114. In an alternative embodiment, the program 116 may run primarily on one or more computers 102 while the server computer 114 may be used for processing and storage of data used by the program 116. It should be noted that the program 116 may be a standalone program or may be integrated into a larger point cloud coding program.

It should be noted, however, that processing for the program 116 may, in some instances be shared amongst the computers 102 and the server computers 114 in any ratio. In another embodiment, the program 116 may operate on more than one computer, server computer, or some combination of computers and server computers, for example, a plurality of computers 102 communicating across the network 110 with a single server computer 114. In another embodiment, for example, the program 116 may operate on a plurality of server computers 114 communicating across the network 110 with a plurality of client computers. Alternatively, the program may operate on a network server communicating across the network with a server and a plurality of client computers.

The network 110 may include wired connections, wireless connections, fiber optic connections, or some combination thereof. In general, the network 110 can be any combination of connections and protocols that will support communications between the computer 102 and the server computer 114. The network 110 may include various types of networks, such as, for example, a local area network (LAN), a wide area network (WAN) such as the Internet, a telecommunication network such as the Public Switched Telephone Network (PSTN), a wireless network, a public switched network, a satellite network, a cellular network (e.g., a fifth generation (5G) network, a long-term evolution (LTE) network, a third generation (3G) network, a code division multiple access (CDMA) network, etc.), a public land mobile network (PLMN), a metropolitan area network (MAN), a private network, an ad hoc network, an intranet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of system 100 may perform one or more functions described as being performed by another set of devices of system 100.

Figure 2A:
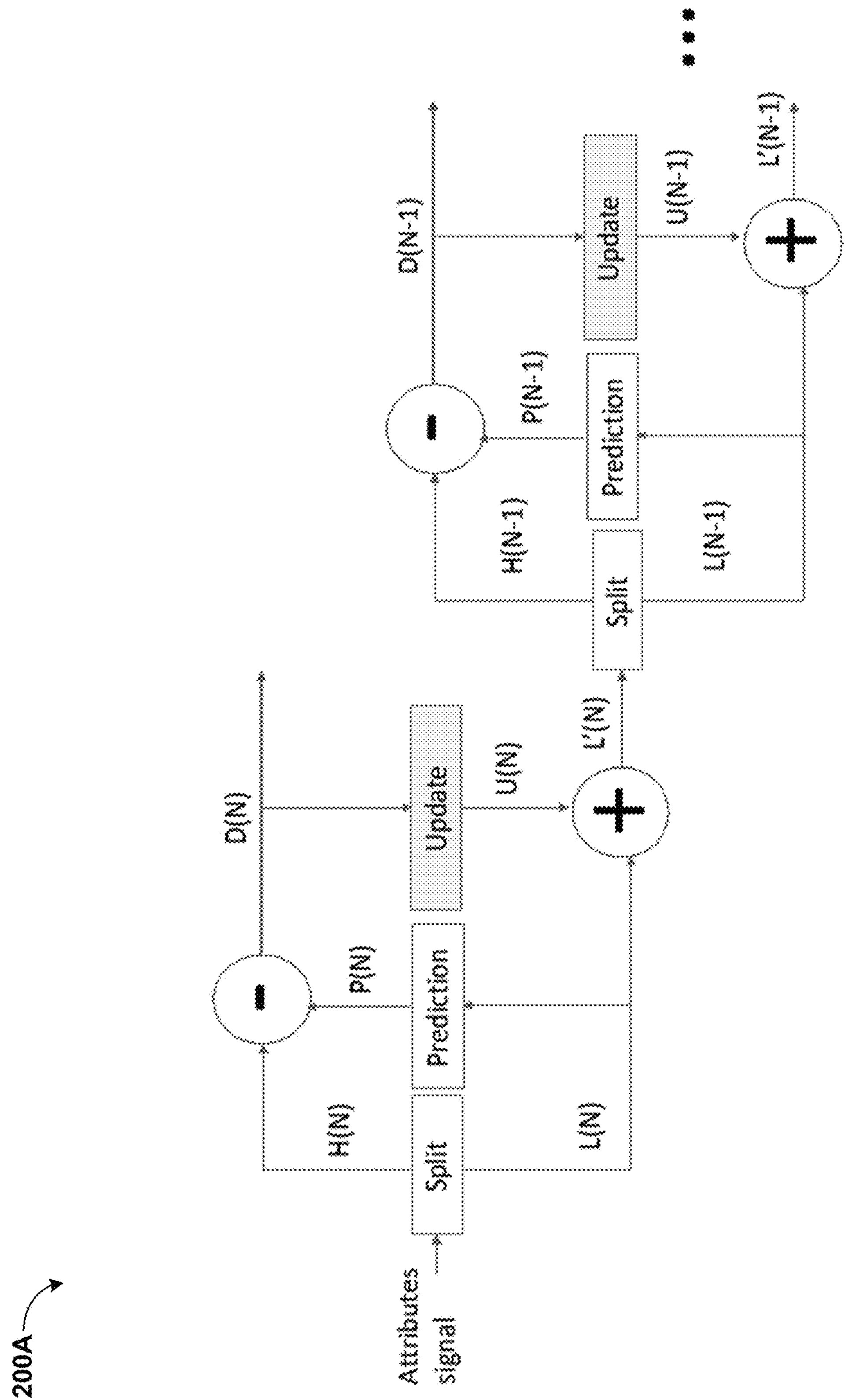
FIGS. 2A-2B are block diagrams of point cloud update systems, according to at least one embodiment.
Figure 2B:
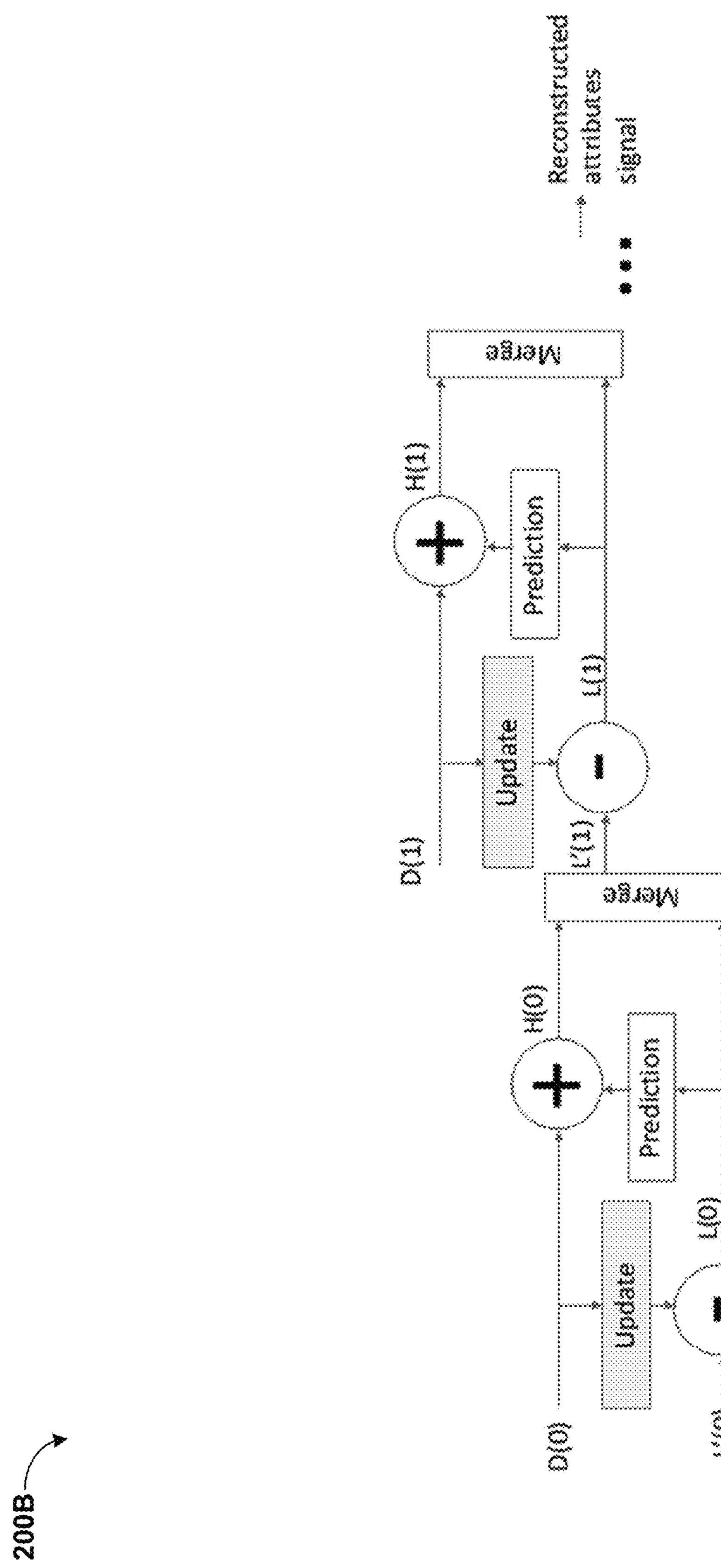

Referring now to FIGS. 2A and 2B, block diagrams 200A and 200B of point cloud update systems are depicted. Block diagram 200A may depict a direct or forward transform in the lifting scheme. Block diagram 200B may depict an inverse transform in the lifting scheme.

For prediction based attribute coding, let $(P_i)_{i=1 \ldots N}$ be the set of positions associated with the point cloud points and let $(M_i)_{i=1 \ldots N}$ be the Morton codes associated with $(P_i)_{i=1 \ldots N}$. First, the points are sorted according to their associated Morton codes in an ascending order. Let I be the array of point indexes ordered according to this process. The encoder/decoder compresses/decompresses respectively the points according to the order defined by I. At each iteration i, a point $P_i$ is selected. The distances of $P_i$ to the s (e.g., s=64) previous points are analyzed and the k (e.g., k=3) nearest neighbors of $P_i$ are selected to be used for prediction. More precisely, the attribute values $(a_i)_{i \in 0 \ldots k-1}$ are predicted by using a linear interpolation process based on the distances of the nearest neighbours of point i. Let $\aleph_i$ be the set of the k-nearest neighbours of the current point i, and let $(\tilde{a}_j)_{j \in \aleph_i}$ be their decoded/reconstructed attribute values and $(\delta_j)_{j \in \aleph_i}$ distances to the current point. The predicted attribute value $\hat{a}_i$ is given by Equation 1 below:

$$\hat{a}_i = \text{Round}\left(\frac{1}{k}\sum_{j \in \aleph_i} \frac{\frac{1}{\delta_j^2}}{\sum_{j \in \aleph_i} \frac{1}{\delta_j^2}} \tilde{a}_j\right) \quad \text{(Equation 1)}$$

Lifting based attribute coding is built upon the prediction-based coding. The main difference compared with prediction-based scheme is that two addition steps are introduced. The first is introduction of an update operator. The second is use of an adaptive quantization strategy.

Figure 2C:
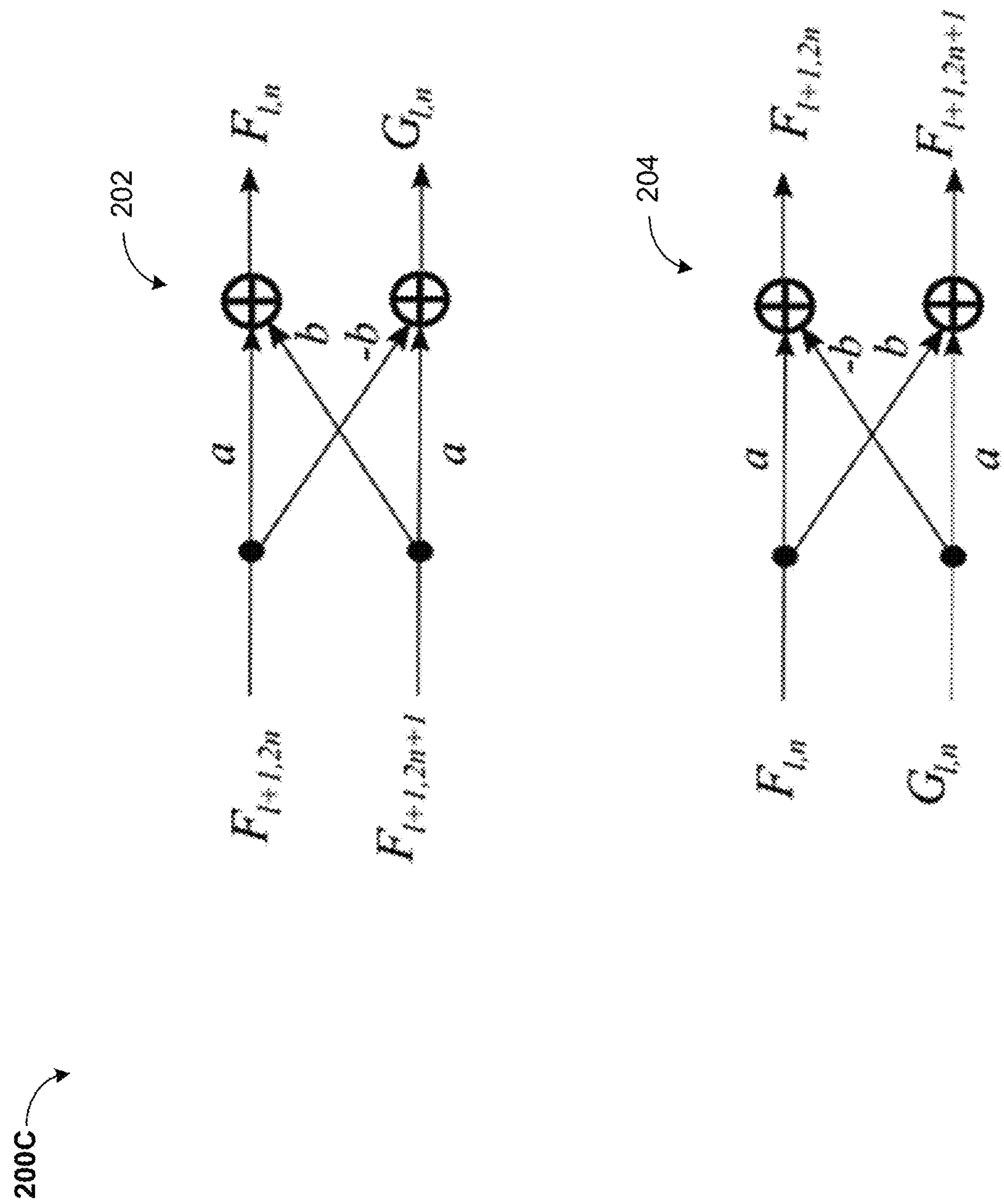
FIG. 2C is a diagram of a region adaptive hierarchical transform (RAHT), according to at least one embodiment.

Referring now to FIG. 2C, a diagram 200C of a region adaptive hierarchical transform (RAHT) is depicted. The block diagram 200C may depict a forward transform 202A and a reverse transform 202B. For RAHT coding, $$a^2 = \frac{w_0}{w_0 + w_1} \text{ and } b^2 = \frac{w_1}{w_0 + w_1},$$

and $w_0$ is the notation of the weight of the input coefficient $F_{l+1,2n}$ while $w_1$ is the same for $F_{l+1,2n+1}$.

For a number of different reasons, point clouds may contain duplicate points, whose geometry positions are the same while their attribute values may or may not be the same. Embodiments may relate to coding these attribute values of duplicate points more efficiently.

Embodiments may be used separately or combined in any order. Further, each of the methods (or embodiments), encoder, and decoder may be implemented by processing circuitry (e.g., one or more processors or one or more integrated circuits). In one example, the one or more processors execute a program that is stored in a non-transitory computer-readable medium.

It should be noted that this disclosure is not limited to the TMC13 software or MPEG-PCC or AVS-PCC standard, it is a general solution for most PCC systems.

Attribute Prediction of Duplicate Points

Because the attribute coding is performed after geometry coding, when coding the attribute values of a given point, its reconstructed geometry position is already known. Therefore, one can utilize such geometry information to improve the coding efficiency of attributes.

Suppose $\{X_i\}$ (i=1,2, . . . , N) be a set of 3D points, and each point $X_i$ is associated with geometry position $P_i$ and attributes $A_i$. Because embodiments may relate to attribute coding, it may be assumed that the geometry positions, i.e., $P_i$, are known for attribute prediction.

First, these points are sorted/grouped based on their geometry positions. In some embodiments, the points are sorted according to the Morton code of geometry positions. All duplicate points are grouped in a chunk and they are then sorted according to their attribute values. Specifically, $\{X_{G_k}\}$ $(G_k = G_k^1, G_k^2, \ldots, G_k^{N_k})$ contains a group of duplicate points where $N_k$ is the number of points in the group and their geometry positions are the same and their attribute values are sorted, for example in ascending order or descending order. Note that in the following discussions, the attribute values are assumed to be sorted in ascending order, i.e., $P_{G_k^l} = P_{G_k^m}$ and $A_{G_k^l} \leq A_{G_k^m}$ for all l<m in the range of 1, 2, . . . , $N_k$. If the attribute is one-dimensional like reflectance, the sorting can be done by their value directly. If the attribute is multiple-dimensional like RGB color, the sorting should be performed along one specific dimension (e.g., either R or G or B). Note that the sorting step is only applied on encoder-side while the decoder parses the attribute prediction residuals directly.

Then, for the chunk of the duplicate points which are sorted by their attribute values, except for the very first point in this chunk, the rest points in the chunk are predicted from the attribute value of its previous reconstructed point in the chunk. Specifically, $A_G k$ is the attribute of the very first point in the chunk, and it can be coded in any means, which is not the focus of this disclosure. For $A_{G_k^l}$(l=2,3, . . . , $N_k$), it can be predicted from the reconstructed attribute value of the previous point, i.e., $R_{G_k^l} = A_{G_k^l} - \hat{A}_{G_k^{l-1}}$, where $R_{G_k^l}$ is the predictive residual of the attribute $A_{G_k^l}$ and $\hat{A}_{G_k^l}$ is the reconstructed attribute value of $A_{G_k^l}$.

Lastly, the predictive residual $R_{G_k^l}$ (l=2,3, . . . , $N_k$) can be coded by entropy coding. Since the attribute values are sorted in ascending order, it is guaranteed that $R_{G_k^l} \geq 0$. Therefore, the sign bit of $R_{G_k^l}$ can be inferred without explicit signaling.

Parsing of Predictive Residual of Duplicate Points

Embodiments discussed above may relate to an encoder point-of-view. Further embodiments may relate to the decoder point-of-view of the parsing process of the predictive residual of duplicate points, i.e., $R_{G_k^l}(l=^2,3, \ldots, N_k)$.

In embodiments, the attribute may be one-dimensional, for example reflectance. A syntax table of such a prediction residual may be as shown in FIG. 2D.

Referring now to FIG. 2D, a table 200D of syntax elements for prediction residuals is depicted. prediction_residual_is_zero may specify if the prediction residual equals to 0. prediction_residual_abs_is_one may specify if the absolute value of the prediction residual equals to 1. prediction_residual_abs_is_two may specify if the absolute value of the prediction residual equals to 2. prediction_residual_abs_minus_three may specify the absolute value of the prediction residual as prediction_residual_minus_three+3. prediction_residual_sign may specify the sign of the prediction residual. isSignBitInferred may specify whether prediction_residual_sign can be inferred or has to be signaled explicitly. isSignBitInferred is set to true if a point has the same geometry position of the previous coded point, i.e., it is a duplicate point.

In another embodiment, the attribute is multiple-dimensional like RGB color. Suppose the points are ordered in ascending order in terms of the first R component. A syntax table of such a prediction residual may be as shown in FIG. 2E.

Referring now to FIG. 2E, a table 200E of syntax elements for prediction residuals is depicted. prediction_residual_is_zero prediction_residual_is_zero[i] may specify if the prediction residual of the $i^{th}$ component equals to 0. prediction_residual_abs_is_one[i] may specify if the absolute value of the prediction residual of the $i^{th}$ component equals to 1. prediction_residual_abs_is_two[i] may specify if the absolute value of the prediction residual of the $i^{th}$ component equals to 2. prediction_residual_abs_minus_three[i] may specify the absolute value of the prediction residual of the $i^{th}$ component as prediction_residual_minus_three[i]+3. isSignBitInferred may specify whether prediction_residual_sign can be inferred or has to be signaled explicitly. isSignBitInferred is set to true if a point has the same geometry position of the previous coded point, i.e., it is a duplicate point. Note that in this embodiment only the R component is checked with isSignBitInferred, because the sorting is performed on R component.

Lossy Attribute Coding

Embodiments discussed above may relate to lossless attribute coding. In lossy attribute coding, the predictive residual $R_{G_k^l}$ may be negative because the reconstructed attribute value $\hat{A}_{G_k^l}$ may be larger than the original attribute value $A_{G_k^l}$. Therefore, the sign bit of the predictive residual $R_{G_k^l}$ can not be inferred in lossy attribute coding, otherwise the encoder-decoder mismatch issue will occur.

Embodiments discussed below may tackle this mismatch issue on lossy attribute coding.

The mismatch issue may be caused by the coarse quantization, and the sign bit of the predictive residual $R_{G_k^l}$ can not be inferred. To solve the issue, two methods are proposed. One is to change the prediction (or quantization) method to make sure the predictive residual $R_{G_k^l}$ is always larger than or equal to zero. Another method is to encode the sign bit of the predictive residual. Examples of these two kinds of methods are presented below.

Generally, the scalar quantization on predictive residual may be done by dividing a quantization scalar followed by a rounding operation as shown in Equation 2 below:

$$Q=(R*QS+\text{offset})\gg\text{shift}, \quad \text{(Equation 2)}$$

where R and Q are predictive residual and quantized residual; the QS is the quantization scalar; the offset and shift are determined by the value of QS.

In an embodiment, to guarantee the predictive residuals of duplicate attributes are always positive, the quantization process of the predictive residuals of all duplicate points, i.e., $R_{G_k^l}$ $(l=1,2,3, \ldots, N_k)$, is applied by dividing the quantization scalar followed by a floor operation, as shown in Equation 3 below:

$$Q'=(R*QS)\gg\text{shift}, \quad \text{(Equation 3)}$$

where the offset value is set to be zero.

In another embodiment, the predictive residual of the first duplicate point in group $G_k$, i.e., $R_{G_k^l}$ is coded losslessly without quantization, and the predictive residuals of the rest of the duplicate points in group $G_k$, i.e., $R_{G_k^l}$ $(l=2,3, \ldots, N_k)$, are quantized by (2) and coded by entropy coding.

In another embodiment, in encoder side, if the predictive residual of duplicate points, i.e., $R_{G_k^l}(l=1,2,3, \ldots, N_k)$, is detected to be negative, it is then forced to be equal to zero and coded as zero.

In another embodiment, the predictive residual of the first duplicate point in group $G_k$, i.e., $R_{G_k^l}$ is coded losslessly without quantization. The predictive residuals of the rest of the duplicate points in group $G_k$, i.e., $R_{G_k^l}(l=2,3, \ldots, N_k)$, are set to zero and coded as zero if detected as negative.

Ways to Code the Sign Bit of the Residual of Duplicate Points

If the predictive residuals cannot be guaranteed to be positive, the sign bit of the predictive residual of duplicate points may be signaled explicitly. A duplicate point generally refers to a point in a point cloud that has the same geometry position of the previous coded point.

In one embodiment, the attribute is one-dimensional like reflectance. A syntax table of such a prediction residual may be as shown in FIG. 2F.

Referring now to FIG. 2F, a table 200F of syntax elements for prediction residuals is depicted. prediction_residual_is_zero may specify if the prediction residual equals to 0. prediction_residual_abs_is_one may specify if the absolute value of the prediction residual equals to 1. prediction_residual_abs_is_two may specify if the absolute value of the prediction residual equals to 2. prediction_residual_abs_minus_three may specify the absolute value of the prediction residual as prediction_residual_minus_three+3. prediction_residual_sign may specify the sign of the prediction residual. isDuplicatePoint is set to true if a point has the same geometry position of the previous coded point, i.e., it is a duplicate point. isAttributeLosslessCoded is set to true if the attribute residual is coded without quantization, otherwise it is set to false. If isAttributeLosslessCoded is false or isDuplicatePoint is false, prediction residual_sign is coded explicitly, otherwise prediction_residual_sign can be inferred as positive. Note that the syntaxes including prediction_residual_is_zero, prediction_residual_abs_is_one, prediction_residual_abs_is two, prediction_residual_abs_minus_three and prediction_residual_sign can be coded by entropy coding either with or without contexts. If they are coded with contexts, the flag isDuplicatePoint can be used as one of the contexts to boost the coding efficiency.

In another embodiment, the attribute is multiple-dimensional like RGB color. Suppose the points are ordered in ascending order in terms of the R component, i.e., the first component. A syntax table of such a prediction residual may be as shown in FIG. 2G.

Referring now to FIG. 2G, a table 200G of syntax elements for prediction residuals is depicted. prediction_residual_is_zero[i] may specify if the prediction residual of the $i^{th}$ component equals to 0. prediction_residual_abs_is_one[i] may specify if the absolute value of the prediction residual of the $i^{th}$ component equals to 1. prediction_residual_abs_is_two[i] may specify if the absolute value of the prediction residual of the $i^{th}$ component equals to 2. prediction_residual_abs_minus_three[i] may specify the absolute value of the prediction residual of the $i^{th}$ component as prediction_residual_minus_three[i]+3. isDuplicatePoint is set to true if a point has the same geometry position of the previous coded point, i.e., it is a duplicate point. Note that in this embodiment only the R component is checked with isDuplicatePoint, because the sorting is performed on R component. isAttributeLosslessCoded is set to true if the attribute residual is coded without quantization, otherwise it is set to false. If i is not 0 or isAttributeLosslessCoded is false or isDuplicatePoint is false, prediction_residual_sign is coded explicitly, otherwise prediction_residual_sign can be inferred as positive. Note that the syntaxes including prediction_residual_is_zero[i], prediction_residual_abs_is_one [i], prediction_residual_abs_is_two[i], prediction_residual_abs_minus_three[i] and prediction_residual_sign [i] can be coded by entropy coding either with or without contexts. If they are coded with contexts, the flag isDuplicatePoint can be used as one of the contexts to boost the coding efficiency.

Figure 3:
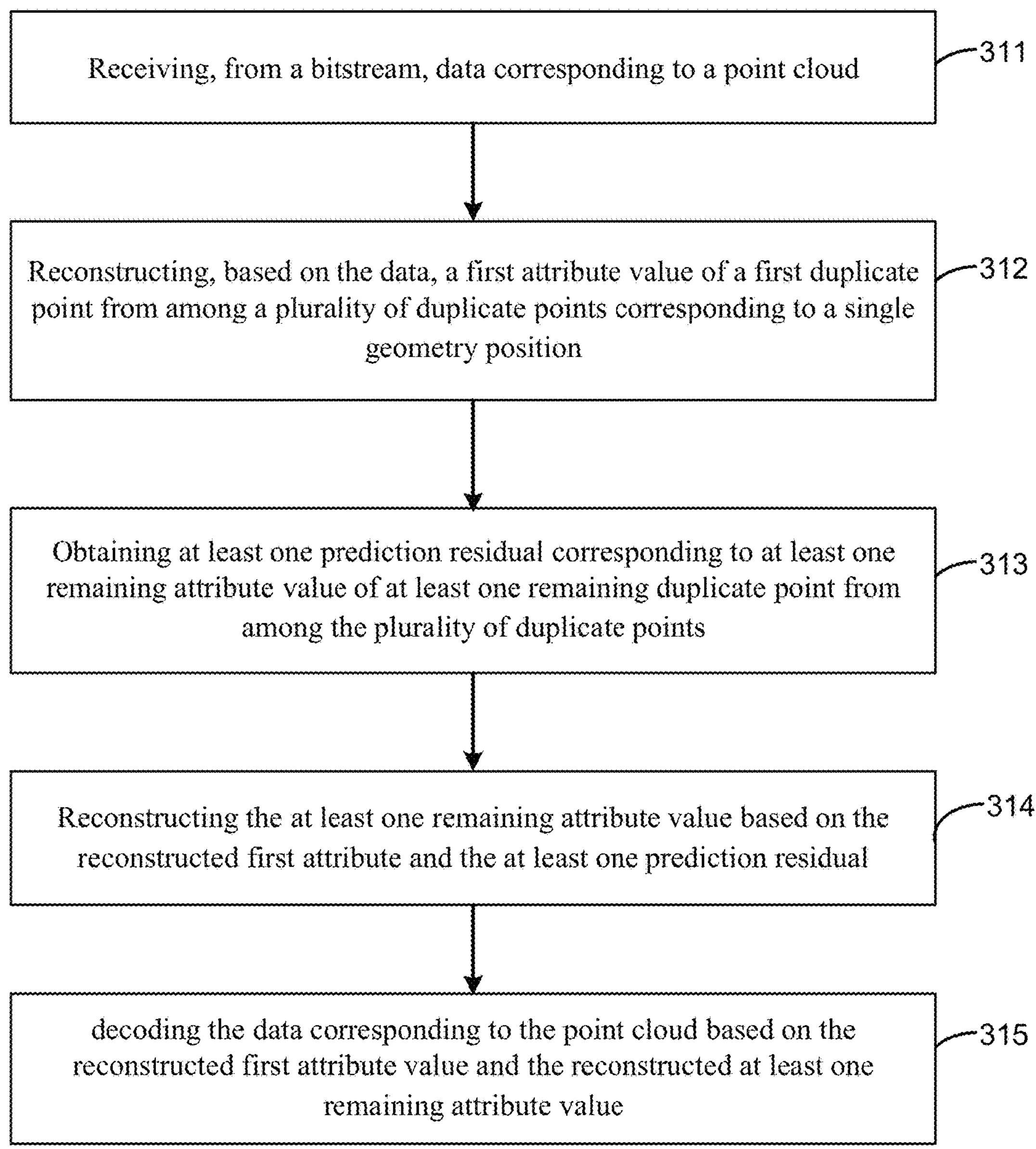
FIG. 3 is an operational flowcharts illustrating the steps carried out by a program for point cloud coding, according to at least one embodiment.

FIG. 3 is a flowchart illustrating an example processes 300 for point cloud coding. FIG. 3 may be described with the aid of FIGS. 1 and 2A-2E. In embodiments, one or more blocks of process 300 may be combined in any order.

As shown in FIG. 3, process 300 may include receiving, from a bitstream, data corresponding to a point cloud (block 311).

As further shown in FIG. 3, process 300 may include reconstructing, based on the data, a first attribute value of a first duplicate point from among a plurality of duplicate points corresponding to a single geometry position (block 312).

As further shown in FIG. 3, process 300 may include obtaining at least one prediction residual corresponding to at least one remaining attribute value of at least one remaining duplicate point from among the plurality of duplicate points (block 313).

As further shown in FIG. 3, process 300 may include reconstructing the at least one remaining attribute value based on the reconstructed first attribute and the at least one prediction residual (block 314).

As further shown in FIG. 3, process 300 may include decoding the data corresponding to the point cloud based on the reconstructed first attribute value and the reconstructed at least one remaining attribute value (block 315).

In embodiments, the plurality of duplicate points may be sorted according to attribute values of an attribute of the plurality of duplicate points.

In embodiments, the plurality of duplicate points may be sorted according to component values of a component included in a multi-component attribute of the plurality of duplicate points.

In embodiments, a sign bit indicating a sign of the at least one prediction residual may be not signaled in the data.

In embodiments, the sign of the at least one prediction residual may be inferred to be positive. In embodiments, the sign of the at least one prediction residual may be inferred to be positive when attributes are in ascending order, and wherein the sign of the at least one prediction residual is inferred to be negative when the attributes are in descending order.

In embodiments, a sign bit indicating a sign of the at least one prediction residual may be signaled in the data.

In embodiments, the data may be encoded such that prediction residuals of attribute values of duplicate points must be greater than or equal to zero. In embodiments, the data may be encoded such that prediction residuals of attribute values of duplicate points are greater than or equal to zero when attributes are in ascending order, and such that the prediction residuals are less than or equal to zero when the attributes are in descending order.

In embodiments, the prediction residuals may be encoded using a floor operation. In embodiments, the prediction residuals may be quantized and rounded by a floor operation.

In embodiments, the data may be encoded such that negative prediction residuals from among prediction residuals of attribute values of duplicate points are encoded as zeroes. In embodiments, the data may be encoded such that prediction residuals from among prediction residuals of attribute values of duplicate points are encoded as zeroes.

It may be appreciated that FIG. 3 provides only illustrations of implementations, and do not imply any limitations with regard to how different embodiments may be implemented. Many modifications to the depicted environments may be made based on design and implementation requirements.

Figure 4:
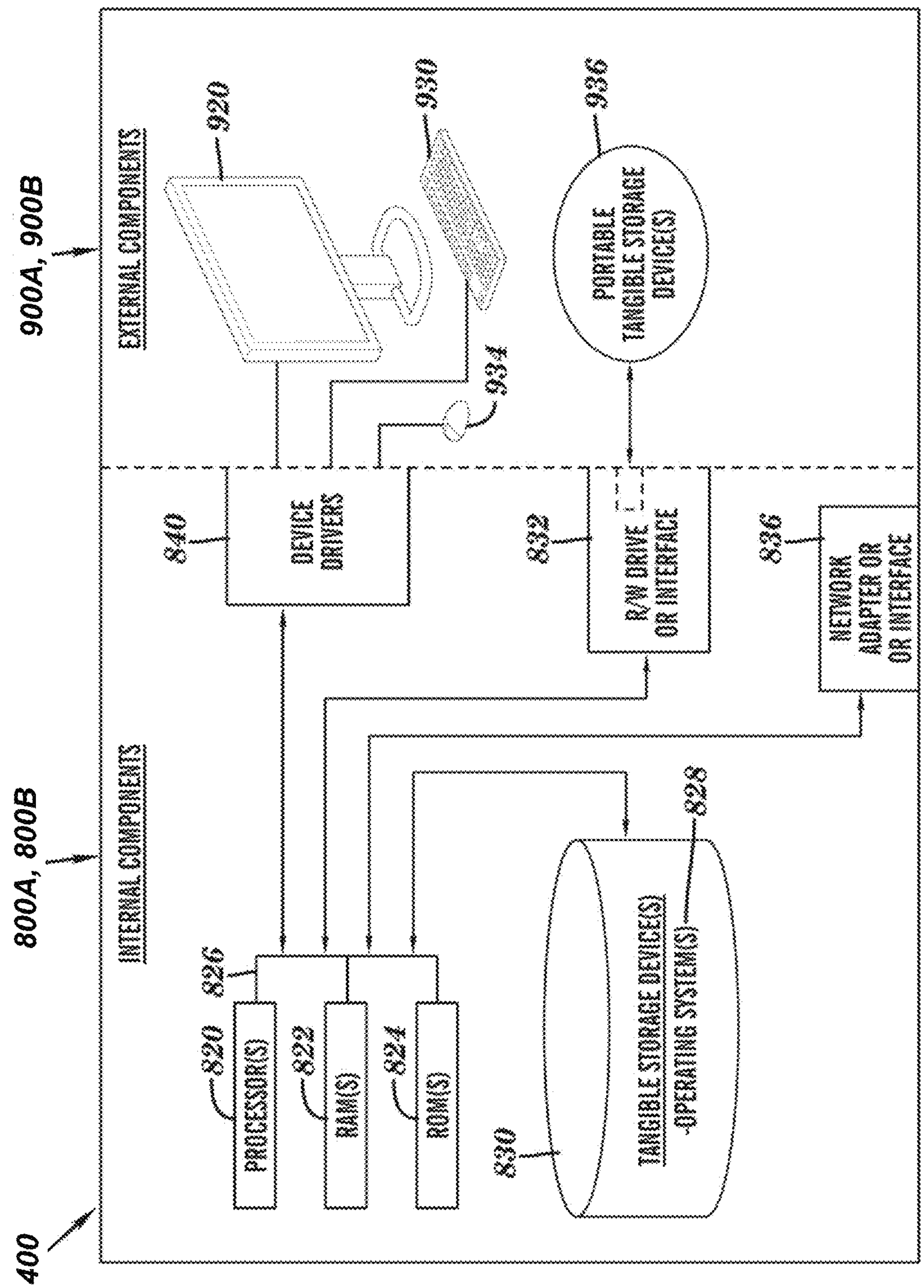
FIG. 4 is a block diagram of internal and external components of computers and servers depicted in FIG. 1 according to at least one embodiment.

FIG. 4 is a block diagram 400 of internal and external components of computers depicted in FIG. 1 in accordance with an illustrative embodiment. It should be appreciated that FIG. 4 provides only an illustration of one implementation and does not imply any limitations with regard to the environments in which different embodiments may be implemented. Many modifications to the depicted environments may be made based on design and implementation requirements.

Figure 5:
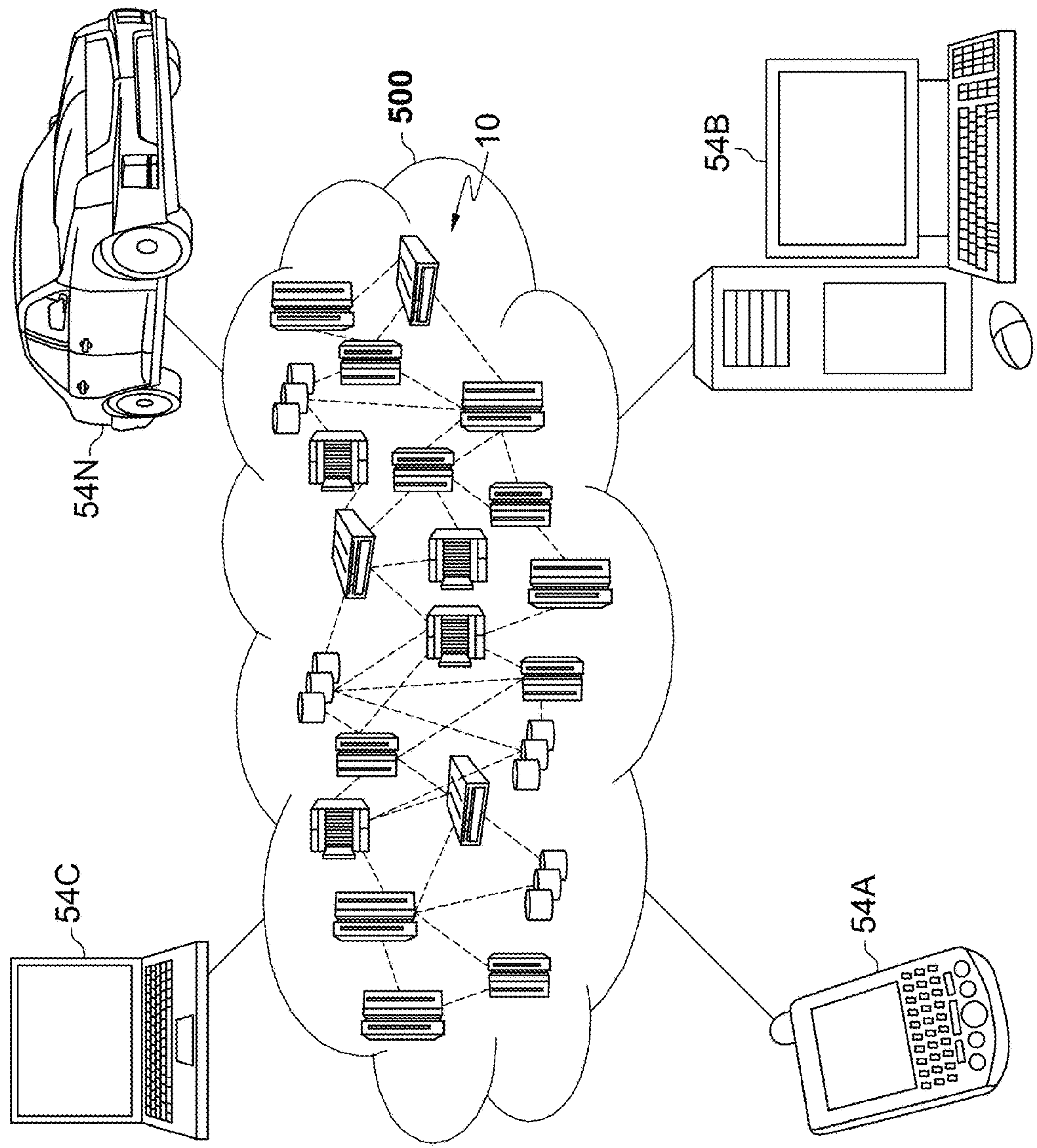
FIG. 5 is a block diagram of an illustrative cloud computing environment including the computer system depicted in FIG. 1, according to at least one embodiment.

Computer 102 (FIG. 1) and server computer 114 (FIG. 1) may include respective sets of internal components 800A,B and external components 900A,B illustrated in FIG. 5. Each of the sets of internal components 800 include one or more processors 820, one or more computer-readable RAMs 822 and one or more computer-readable ROMs 824 on one or more buses 826, one or more operating systems 828, and one or more computer-readable tangible storage devices 830.

Processor 820 is implemented in hardware, firmware, or a combination of hardware and software. Processor 820 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 820 includes one or more processors capable of being programmed to perform a function. Bus 826 includes a component that permits communication among the internal components 800A,B.

The one or more operating systems 828, the software program 108 (FIG. 1) and the Point Cloud Coding Program 116 (FIG. 1) on server computer 114 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 4, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory, an optical disk, a magneto-optic disk, a solid state disk, a compact disc (CD), a digital versatile disc (DVD), a floppy disk, a cartridge, a magnetic tape, and/or another type of non-transitory computer-readable tangible storage device that can store a computer program and digital information.

Each set of internal components 800A,B also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as the software program 108 (FIG. 1) and the Point Cloud Coding Program 116 (FIG. 1) can be stored on one or more of the respective portable computer-readable tangible storage devices 936, read via the respective R/W drive or interface 832 and loaded into the respective hard drive 830.

Each set of internal components 800A,B also includes network adapters or interfaces 836 such as a TCP/IP adapter cards; wireless Wi-Fi interface cards; or 3G, 4G, or 5G wireless interface cards or other wired or wireless communication links. The software program 108 (FIG. 1) and the Point Cloud Coding Program 116 (FIG. 1) on the server computer 114 (FIG. 1) can be downloaded to the computer 102 (FIG. 1) and server computer 114 from an external computer via a network (for example, the Internet, a local area network or other, wide area network) and respective network adapters or interfaces 836. From the network adapters or interfaces 836, the software program 108 and the Point Cloud Coding Program 116 on the server computer 114 are loaded into the respective hard drive 830. The network may comprise copper wires, optical fibers, wireless transmission, routers, firewalls, switches, gateway computers and/or edge servers.

Each of the sets of external components 900A,B can include a computer display monitor 920, a keyboard 930, and a computer mouse 934. External components 900A,B can also include touch screens, virtual keyboards, touch pads, pointing devices, and other human interface devices. Each of the sets of internal components 800A,B also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

It is understood in advance that although this disclosure includes a detailed description on cloud computing, implementation of the teachings recited herein are not limited to a cloud computing environment. Rather, some embodiments are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (laaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Referring to FIG. 5, illustrative cloud computing environment 500 is depicted. As shown, cloud computing environment 500 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 54A-N shown in FIG. 5 are intended to be illustrative only and that cloud computing nodes 10 and cloud computing environment 500 can communicate with any type of computerized device over any type of network and/or network addressable connection (e.g., using a web browser).

Figure 6:
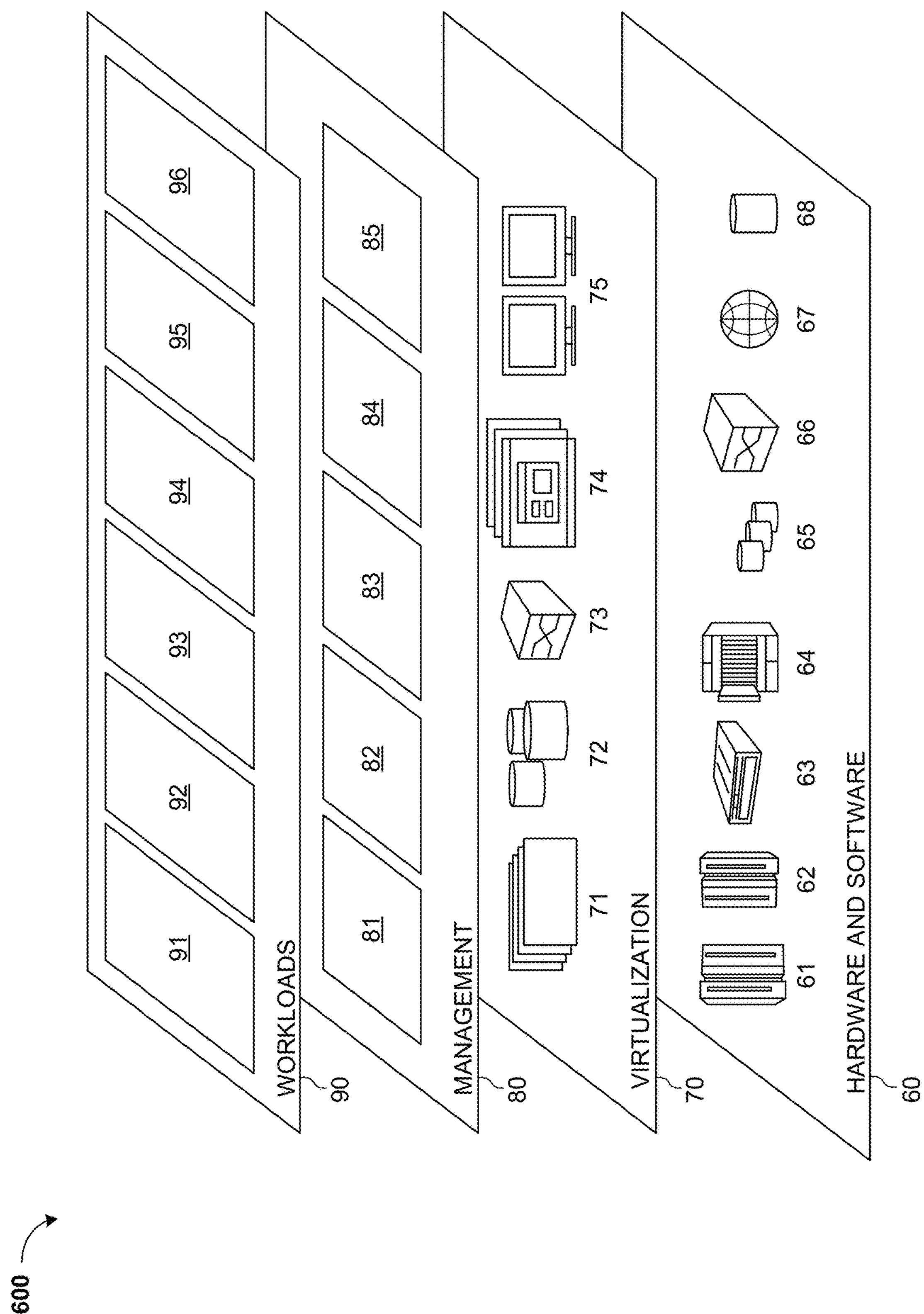
FIG. 6 is a block diagram of functional layers of the illustrative cloud computing environment of FIG. 5, according to at least one embodiment.

Referring to FIG. 6, a set of functional abstraction layers 600 provided by cloud computing environment 500 (FIG. 5) is shown. It should be understood in advance that the components, layers, and functions shown in FIG. 6 are intended to be illustrative only and embodiments are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and Point Cloud Coding 96. Point Cloud Coding 96 may decode point cloud data based on inter-component correlations.

Some embodiments may relate to a system, a method, and/or a computer readable medium at any possible technical detail level of integration. The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of decoding point clouds, executable by a processor, comprising:
- receiving, from a bitstream, data corresponding to a point cloud;
- determining a plurality of duplicate points corresponding to a geometry position,
  - wherein the plurality of duplicate points have a same geometry position but more than one attribute value, and
  - wherein the plurality of duplicate points are soiled according to attribute values of an attribute of the plurality of duplicate points;
- reconstructing, based on the data, a first attribute value of a first duplicate point from among the plurality of duplicate points;

obtaining at least one prediction residual corresponding to at least one remaining attribute value of at least one remaining duplicate point from among the plurality of duplicate points;

reconstructing the at least one remaining attribute value based on the reconstructed first attribute and the at least one prediction residual; and decoding the data corresponding to the point cloud based on the reconstructed first attribute value and the reconstructed at least one remaining attribute value.

2. The method of claim 1, wherein the plurality of duplicate points are sorted according to component values of a component included in a multi-component attribute of the plurality of duplicate points.

3. The method of claim 1, wherein a sign bit indicating a sign of the at least one prediction residual is not signaled in the data.

4. The method of claim 3, wherein the sign of the at least one prediction residual is inferred to be positive when attributes are in ascending order, and wherein the sign of the at least one prediction residual is inferred to be negative when the attributes are in descending order.

5. The method of claim 1, wherein a sign bit indicating a sign of the at least one prediction residual is signaled in the data.

6. The method of claim 1, wherein the data is encoded such that prediction residuals of attribute values of duplicate points are greater than or equal to zero when attributes are in ascending order, and wherein the prediction residuals are less than or equal to zero when the attributes are in descending order.

7. The method of claim 6, wherein the prediction residuals are quantized and rounded by a floor operation.

8. The method of claim 1, wherein the data is encoded such that prediction residuals from among prediction residuals of attribute values of duplicate points are encoded as zeroes.

9. A computer system for decoding point clouds, the computer system comprising:

one or more computer-readable non-transitory storage media configured to store computer program code; and one or more processors configured to access the computer program code and operate as instructed by the computer program code, said computer program code including:

receiving code configured to cause the one or more processors to receive, from a bitstream, data corresponding to a point cloud;

first determining code configured to cause the one or more processors to determine a plurality of decoding points corresponding to a geometry position, wherein the plurality of duplicate points have a same geometry position, but more than one attribute value, and wherein the plurality of duplicate points are sorted according to attribute values of an attribute of the plurality of duplicate points;

first reconstructing code configured to cause the one or more processors to reconstruct, based on the data, a first attribute value of a first duplicate point from among the plurality of duplicate points corresponding to a single geometry position;

obtaining code configured to cause the one or more processors to obtain at least one prediction residual corresponding to at least one remaining attribute value of at least one remaining duplicate point from among the plurality of duplicate points;

second reconstructing code configured to cause the one or more processors to reconstruct the at least one remaining attribute value based on the reconstructed first attribute and the at least one prediction residual; and decoding code configured to cause the one or more processors to decode the data corresponding to the point cloud based on the reconstructed first attribute value and the reconstructed at least one remaining attribute value.

10. The computer system of claim 9, wherein the plurality of duplicate points are sorted according to component values of a component included in a multi-component attribute of the plurality of duplicate points.

11. The computer system of claim 9, wherein a sign bit indicating a sign of the at least one prediction residual is not signaled in the data.

12. The computer system of claim 11, wherein the sign of the at least one prediction residual is inferred to be positive when attributes are in ascending order, and wherein the sign of the at least one prediction residual is inferred to be negative when the attributes are in descending order.

13. The computer system of claim 9, wherein a sign bit indicating a sign of the at least one prediction residual is signaled in the data.

14. The computer system of claim 9, wherein the data is encoded such that prediction residuals of attribute values of duplicate points are greater than or equal to zero when attributes are in ascending order, and wherein the prediction residuals are less than or equal to zero when the attributes are in descending order.

15. The computer system of claim 14, wherein the prediction residuals quantized and rounded by a floor operation.

16. The computer system of claim 9, wherein the data is encoded such that prediction residuals from among prediction residuals of attribute values of duplicate points are encoded as zeroes.

17. A non-transitory computer readable medium having stored thereon a computer program for decoding point clouds, the computer program configured to cause one or more computer processors to:

receive, from a bitstream, data corresponding to a point cloud;

determine a plurality of duplicate points corresponding to a geometry position, wherein the plurality of duplicate points have a same geometry position but more than one attribute value, and wherein the plurality of duplicate points are sorted according to attribute values of an attribute of the plurality of duplicate points;

reconstruct, based on the data, a first attribute value of a first duplicate point from among the plurality of duplicate points corresponding to a single geometry position;

obtain at least one prediction residual corresponding to at least one remaining attribute value of at least one remaining duplicate point from among the plurality of duplicate points;

reconstruct the at least one remaining attribute value based on the reconstructed first attribute and the at least one prediction residual; and decode the data corresponding to the point cloud based on the reconstructed first attribute value and the reconstructed at least one remaining attribute value.

18. The non-transitory computer readable medium of claim 17, wherein the data is encoded such that prediction residuals from among prediction residuals of attribute values of duplicate points are encoded as zeroes.

* * * * *